United States Patent
Hsu

[11] Patent Number: 5,858,841
[45] Date of Patent: Jan. 12, 1999

[54] ROM DEVICE HAVING MEMORY UNITS ARRANGED IN THREE DIMENSIONS, AND A METHOD OF MAKING THE SAME

[75] Inventor: Chen-Chung Hsu, Taichung, Taiwan

[73] Assignee: United Microelectronics Corporation, Taiwan

[21] Appl. No.: 977,535

[22] Filed: Nov. 25, 1997

Related U.S. Application Data

[62] Division of Ser. No. 835,924, Apr. 10, 1997, Pat. No. 5,763,925.

[30] Foreign Application Priority Data

Jan. 20, 1997 [TW] Taiwan ................................. 86100572

[51] Int. Cl.⁶ ............................................ H01L 21/8246
[52] U.S. Cl. ........................................... 438/278; 438/270
[58] Field of Search ................................. 438/268, 270, 438/275, 276, 277, 278, 289, 290, 589

[56] References Cited

U.S. PATENT DOCUMENTS

| | | | |
|---|---|---|---|
| 5,021,355 | 6/1991 | Dhong et al. | 438/270 |
| 5,504,025 | 4/1996 | Fong-Chung et al. | 438/278 |
| 5,627,091 | 5/1997 | Hong | 438/278 |
| 5,744,393 | 4/1998 | Risch et al. | 438/278 |

*Primary Examiner*—Chandra Chaudhari
*Attorney, Agent, or Firm*—Rabin & Champagne, P.C.

[57] ABSTRACT

A three-dimensional ROM device includes a silicon substrate having plurality of parallel trenches formed in an upper surface thereof, and a plurality of raised mesa regions. Each trench has a bottom and a pair of sidewalls, and is separated from an adjacent trench by a respective mesa region. A plurality of separated, parallel source/drain regions are provided, including a first and second source/drain region located on respective opposite sides of a respective trench bottom, and a third and fourth source/drain region located on respective opposite sides of a respective raised mesa region. Each source/drain region serves as a bit line. A gate oxide layer is located on the upper surface of the silicon substrate. A plurality of sidewall oxide layers are formed on selected sidewalls and serve as channel barriers. A plurality of silicon nitride layers are formed above selected mesa regions and trench bottoms, and serve as channel barriers. A plurality of gate layers are located over the gate oxide layer and the silicon nitride layers and serve as word lines. A region between any two adjacent source/drain regions comprises a channel region.

6 Claims, 4 Drawing Sheets

ROM DEVICE HAVING MEMORY UNITS ARRANGED IN THREE DIMENSIONS, AND A METHOD OF MAKING THE SAME

This is a Division of application Ser. No. 08/835,924, now U.S. Pat. No. 5,763,925 filed Apr. 10, 1997.

BACKGROUND OF THE INVENTION

1. Field of Invention

The present invention relates, in general, to a read only memory (ROM) device, and more particularly, to a ROM device having memory units arranged in three dimensions, and a method of making the same.

2. Description of Related Art

ROM devices are widely used inside personal computers, microprocessors and other digital systems. In general, a ROM device is typically used as the main memory device for the storage of information in digital systems. The ROM devices used in different equipment are basically identical in structure, except for their coded contents. As such, manufacturers typically fabricate semi-finished ROM devices which are complete with the exception of the actual program coding step. The semi-finished ROM devices are then stocked by the manufacturer. Once the customer supplies the desired codes to the manufacturer, the manufacturer can rapidly fabricate the necessary set of coding masks according to the customer's requirements and standards, so that the coding implantation can be immediately performed. After the completion of the coding implantation and other subsequent steps, the finished ROM devices can be supplied to the customer in a fast and efficient manner. Hence, methods of making ROM devices that use programming masks in a later part of the manufacturing cycle are preferred by the industry.

From the perspective of an integrated circuit manufacturer, major issues include the reduction of the area occupied by the integrated circuits, increasing the level of integration, the reduction of production costs, and increasing market share.

However, in a conventional ROM device, each gate region, comprised for example of polysilicon, is formed on the same planar surface as the other gate regions. This requires a relatively large footprint. Once the characteristic dimensions of the ROM device have been reduced to their ultimate limits (such as line separation, line width, or channel width), the surface area occupied by the integrated circuit cannot be further reduced, and therefore production costs cannot be further reduced.

FIG. 1a shows the structure of a conventional ROM device. The manufacture of a conventional ROM device includes forming an array of parallel, embedded source/drain regions 11 (composed of, for example, an N-type material) above a substrate 10 (for example, a P-type substrate). A gate oxide layer 12 is formed above the substrate 10, and a polysilicon gate layer 13 is formed above the gate oxide layer 12. The term "source/drain region" refers to both a source or a drain terminal. As such, each source/drain region 11 is either a source or a drain terminal, as determined solely by the metallic wiring connection.

Referring next to FIG. 1b, in a subsequent coding step, a patterned photoresist layer 15 is formed above the polysilicon gate layer 13, so that polysilicon gate regions 13' are exposed. These exposed regions will form memory cells having an OFF state, as will be subsequently described. Then, and referring to FIG. 1c, impurities are implanted into the channel region 16 using an ion implantation method. As a result, the threshold voltage of these memory cells are changed, with their memory content being permanently fixed in the OFF state. Finally, the photoresist layer 15 is removed to complete the manufacturing of a conventional ROM device.

As described before, all polysilicon gate regions 13' are located on the same planar surface; therefore, for every two polysilicon gate regions 13', a predetermined gap must exist therebetween, which makes any further reduction in the area occupied by the ROM device difficult.

SUMMARY OF THE INVENTION

It is therefore an object of the present invention to provide a method of making a three-dimensional ROM device, in which transistors are arranged in three dimensions. Through the use of this three-dimensional structural configuration, the area occupied by the ROM device in an integrated circuit can be greatly reduced.

Another object of this invention is to provide a three-dimensional ROM device having a higher level of integration than conventional ROM devices.

These and other objects are accomplished by providing a three-dimensional ROM device, including a silicon substrate having plurality of parallel trenches formed in an upper surface thereof, and a plurality of raised mesa regions. Each trench has a bottom and a pair of sidewalls, and is separated from an adjacent trench by a respective mesa region. A plurality of separated, parallel source/drain regions are provided, including a first and a second source/drain region located on respective opposite sides of a respective trench bottom, and a third and a fourth source/drain region located on respective opposite sides of a respective raised mesa region. Each source/drain region serves as a bit line. A gate oxide layer is located on the upper surface of the silicon substrate. A plurality of sidewall oxide layers are formed on selected sidewalls and serve as channel barriers. A plurality of silicon nitride layers are formed above selected mesa regions and trench bottoms, and serve as channel barriers. A plurality of gate layers are located over the gate oxide layer and the silicon nitride layers and serve as word lines. A region between any two adjacent source/drain regions comprises a channel region.

Through the above arrangement, the source/drain regions on opposite sides of every mesa region and trench region act as bit lines, while the middle part of the same regions act as a channel. Thus, a horizontal memory unit is formed at each cross-over point of a bit line and a gate polysilicon word line. Additionally, an OFF state can be fixed upon a particular horizontal memory unit by forming an extra silicon oxide layer on top. Similarly, each trench sidewall has two adjacent bit lines, (i.e., one at the top and one at the bottom). Thus, the sidewall can act as a channel, so that a vertical memory unit is formed at each cross-over point of the gate polysilicon word line with the bit line. An OFF state can be fixed upon a particular vertical memory unit by forming an extra sidewall oxide layer that covers the sidewall. Such a three-dimensional ROM structure, having horizontal and vertical memory units programmed to be either in an ON or OFF state through the selective formation of a sidewall oxide layer and a silicon nitride layer, greatly increases the level of integration of the memory components.

BRIEF DESCRIPTION OF THE DRAWINGS

Other objects, features, and advantages of the present invention will become apparent from the following detailed description of the preferred but non-limiting embodiment. The description is made with reference to the accompanying drawings.

FIG. 1c is a cross-sectional view of the ROM device in FIG. 1a.

DESCRIPTION OF THE PREFERRED EMBODIMENT

According to the present invention, the manufacturing of a three-dimensional ROM device includes the following.

Figure 1A:
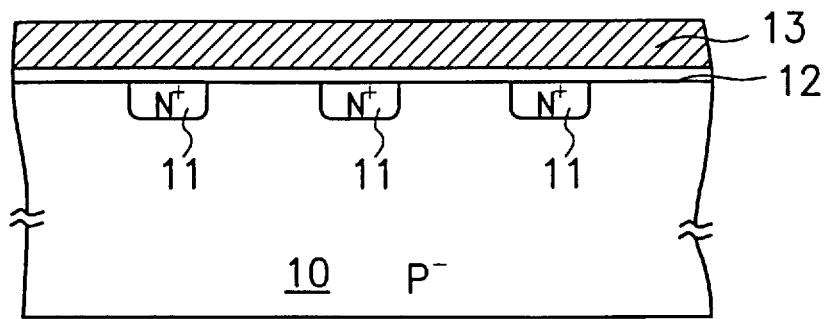
FIG. 1a is a cross-sectional view of a substrate of a conventional ROM device.
Figure 1B:
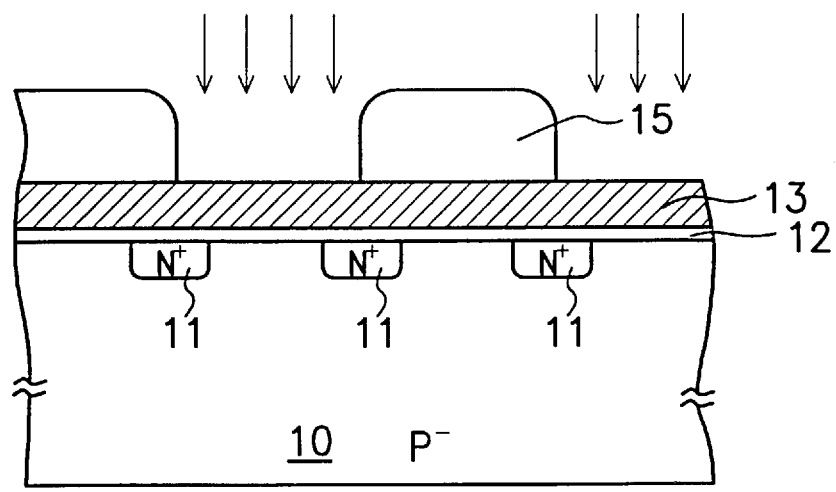
FIG. 1b is a cross-sectional view of the ROM device in FIG. 1a undergoing a coding implantation.
Figure 1C:
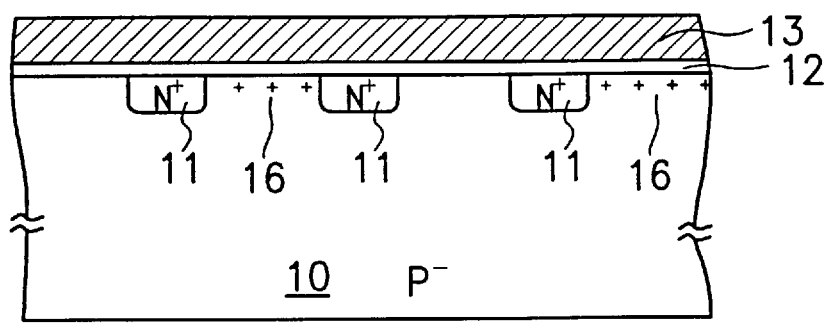
Figure 2A:
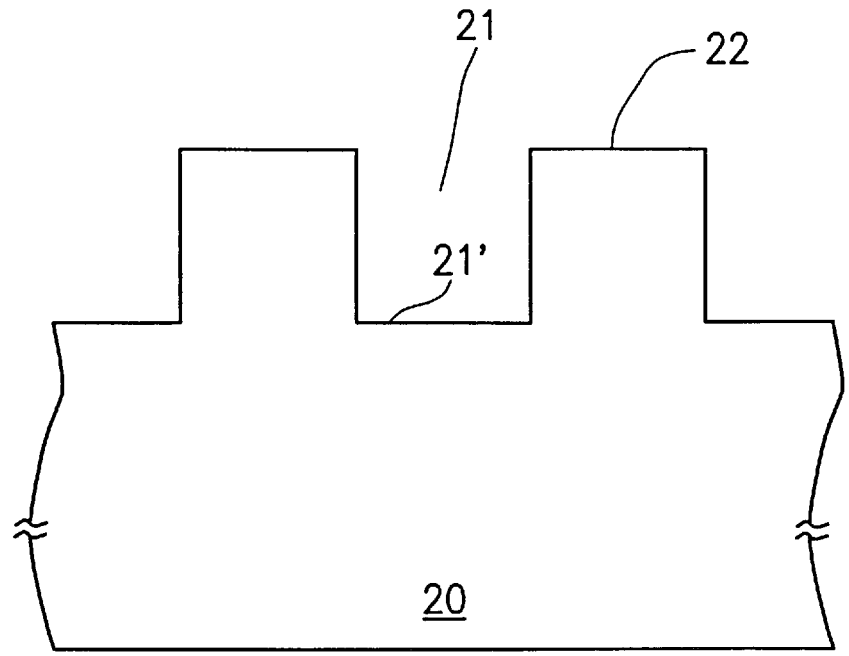
FIGS. 2a through 2g are cross-sectional diagrams of a three-dimensional ROM device during various stages of manufacture, according to the present invention.

First, and referring to FIG. 2a, a series of parallel trenches 21 are formed in a silicon substrate 20 at equal distance from each other. Each trench has a base or bottom 21', and two sidewalls 31. Between every two adjacent trenches 21 is a mesa region 22. Generally, the mesa regions 22 are located at a level higher than the base 21' of the trenches 21. Moreover, the depth of each trench 21 is approximately equal to the width of two embedded N-type doped regions and a channel region combined.

Figure 2B:
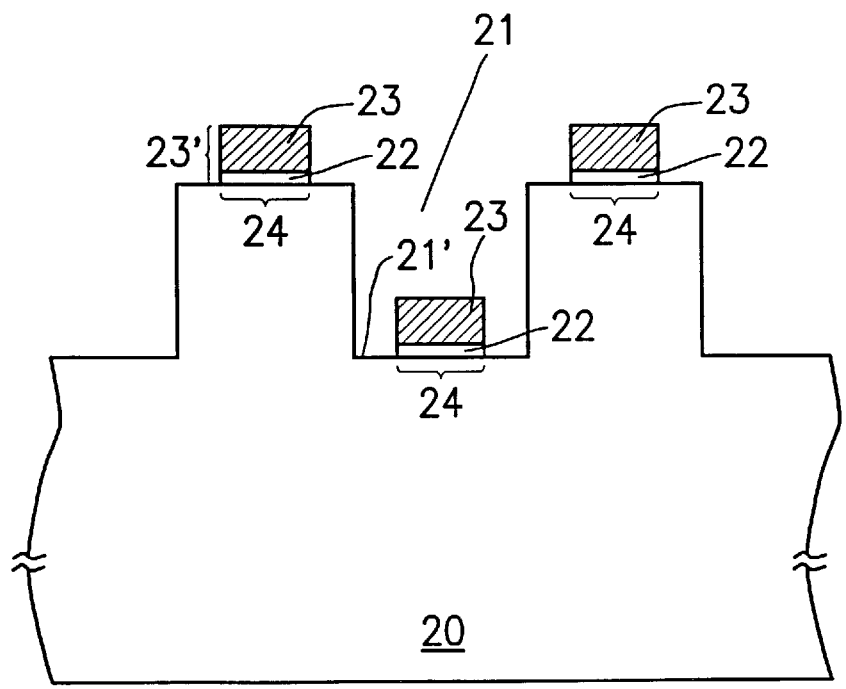

Referring next to FIG. 2b, a layer of surface oxide 22 (with thickness of about 150 Å), and then a layer of silicon nitride 23 (with a thickness between approximately 1500 Å to 3000 Å) are deposited above the silicon substrate 20 to form a composite layer 23', using a low pressure chemical vapor deposition (LPCVD) method. Thereafter, the composite layer 23' is patterned, in preparation for the subsequent formation of channel regions 24 located both in the base 21' of the trenches 21, and in the mesa regions 22.

Figure 2C:
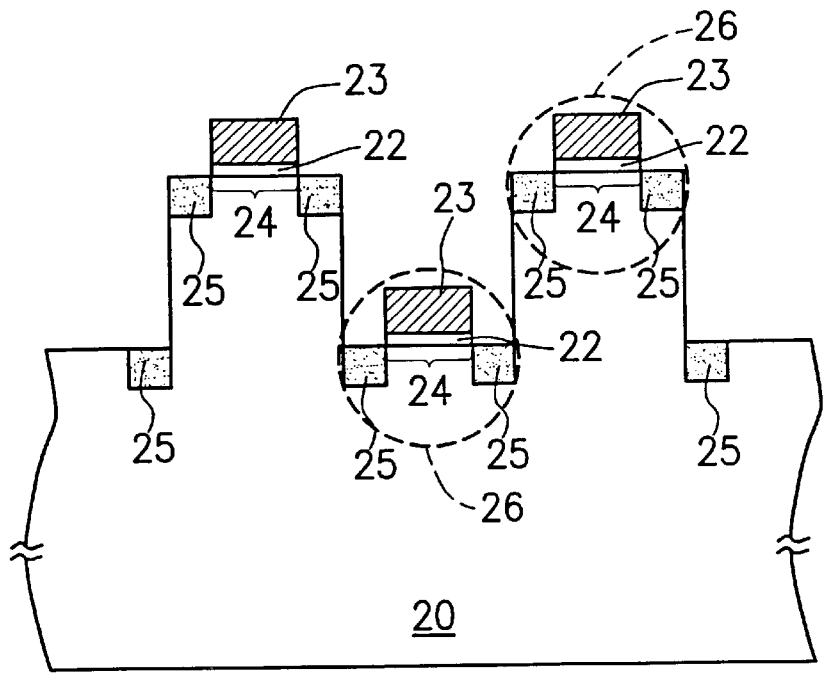

Referring next to FIG. 2c, using the patterned composite layers 23' as masks, ions are implanted to form source/drain regions 25. For example, arsenic ions having an energy between about 50 KeV and 100 KeV and a dosage between about $1 \times 10^{14}$ atoms/cm$^2$ and $1 \times 10^{16}$ atoms/cm$^2$ are implanted into the silicon substrate 20. Alternatively, phosphorus ions having an energy between about 20 KeV and 60 KeV and a dosage between about $1 \times 10^{14}$ atoms/cm$^2$ and $1 \times 10^{16}$ atoms/cm$^2$ are implanted into the silicon substrate 20. Using the above processes, the source/drain regions 25 are formed in the base 21' of the trenches 21, and on opposite sides thereof. Moreover, source/drain regions 25 are also formed in opposite sides of the respective mesa regions 22. Each channel region 24 and two adjacent, parallel source/drain regions 25 together form a memory unit 26.

Figure 2D:
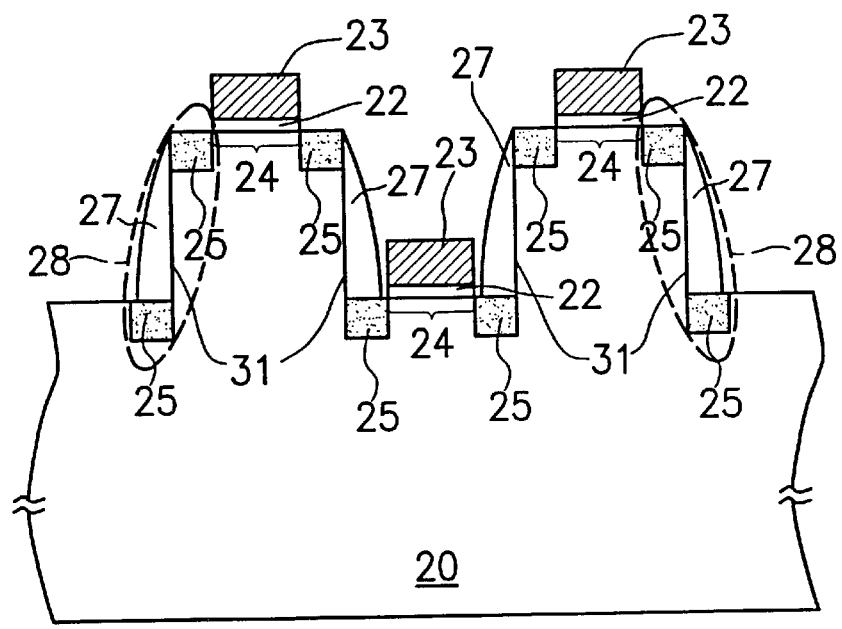

Referring next to FIG. 2d, an oxide layer is formed above the silicon substrate 20, and is then etched back to form sidewall spacers 27 which cover sidewalls 31. Each sidewall 31 and spacer 27 can act as another channel 31'. Thus, the source/drain regions 25 located at the top (i.e., in the mesa region 22) and bottom (i.e., at the base 21') of a respective sidewall 31, together with the associated channel 31', form another memory unit 28.

Figure 2E:
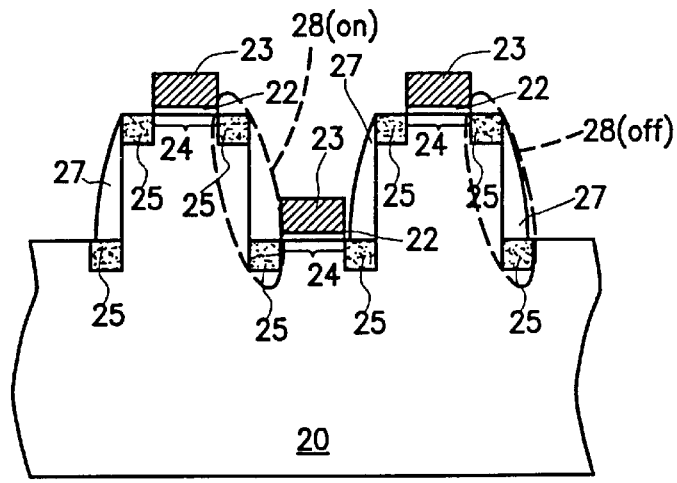

Referring next to FIG. 2e, in a subsequent step, the memory units 28 are program coded. Where the sidewall 31 is covered by a sidewall spacer 27, a memory unit 28 having an OFF state is obtained. Similarly, where the sidewall 31 is not covered by a sidewall spacer 27, a memory unit 28 having an ON state is obtained. For example, a photoresist layer (not shown in the Figure) may be formed above the sidewall spacers 27, silicon substrate 20 and silicon nitride layer 23. Then, the photoresist layer may be defined with a pattern such that the sidewall spacers 27 of the memory units 28 designated to be in an OFF state are covered, while the remaining sidewall spacers 27 of memory units 28 designated to be in an ON state are exposed. Thereafter, the exposed sidewall spacers 27 are etched away, followed by the removal of the photoresist layer. Through such operation, memory units 28 covered by a sidewall spacer 27 are OFF, with the spacer 27 serving as a channel barrier, while the rest of the memory units 28 having the respective sidewall spacers 27 etched away are ON.

Figure 2F:
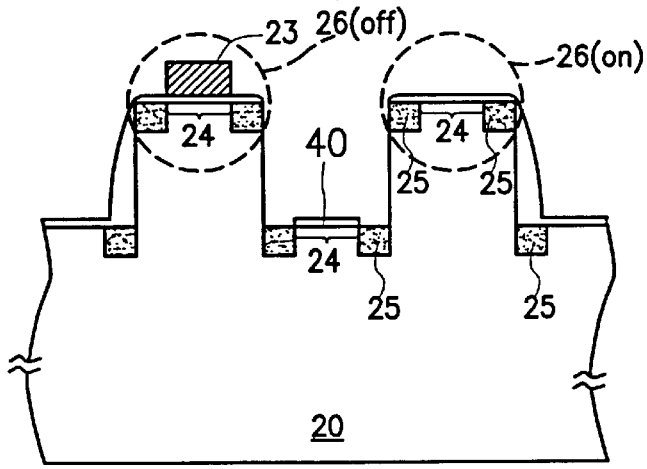

Referring next to FIG. 2f, in a subsequent step, the memory units 26 are also program coded. The silicon nitride layer 23 is selectively etched to remove a part of it such that memory units 26 still covered by a silicon nitride layer 23 are in an OFF state, while memory units 26 whose silicon nitride layers 23 are etched away are in an ON state. The silicon nitride layer 23 serves as a channel barrier and isolates the channel 24 of the mesa region 22, so that the corresponding transistor is non-conducting. Thereafter, a gate oxide layer 40 with a thickness between about 50 Å and about 250 Å is formed on the surface of the silicon substrate 20.

Figure 2G:
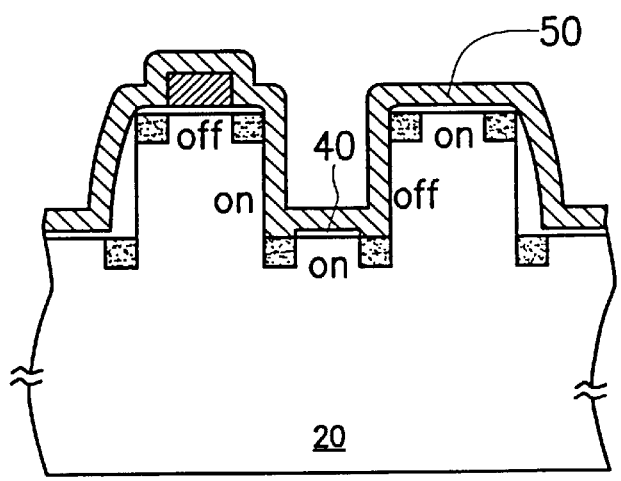

Referring next to FIG. 2g, a polysilicon layer 50 with a thickness between about 1500 Å and about 3000 Å is deposited above the gate oxide layer 40 and the silicon nitride layer 23. Then, photolithographic and etching processes are used to define a pattern on the polysilicon layer 50 to form a plurality of polysilicon gate layers, which serve as word lines (not shown), and which are separated from each other by an essentially equal distance.

Lastly, subsequent processing steps are performed which include interconnecting the components with metallic wiring. This completes the high-density three-dimensional ROM device according to the present invention.

In summary, the three-dimensional ROM device according to the present invention uses the presence or absence of gate silicon nitride layers and sidewall spacers to program an ON or OFF state to the memory units. Also, three-dimensional space is fully utilized, resulting in an increase in the level of integration of ROM integrated circuits.

While the invention has been described by way of example and in terms of a preferred embodiment, it is to be understood that the invention is not limited to the disclosed embodiment. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method of making a three-dimensionally arranged ROM device, comprising:

forming a plurality of parallel trenches in an upper surface of a silicon substrate, each trench having a bottom and a pair of sidewalls, and being separated from an adjacent trench by a respective one of a plurality of raised mesa regions;

depositing a silicon nitride layer over the silicon substrate;

patterning the silicon nitride layer to expose a portion of the trench bottoms, and a portion of the raised mesa regions, and thereby forming a plurality of silicon nitride layers;

using the patterned silicon nitride layers as a mask, and implanting ions in the exposed portions to form a plurality of source/drain regions with the unexposed portions of the trench bottoms and the raised mesa regions forming channel regions;

forming a plurality of sidewall oxide layers on the respective trench sidewalls;

removing selected sidewall oxide layers for program coding of the ROM device;

removing selected silicon nitride layers for program coding of the ROM device;

forming a gate oxide layer over the upper surface of the silicon substrate;

depositing a polysilicon layer over the silicon nitride layers and gate oxide layer; and patterning the polysilicon layer to form a plurality of polysilicon word lines.

2. The method defined in claim 1, wherein said forming a plurality of parallel trenches includes forming the trenches to a depth roughly equal to a width of two source/drain regions and a channel region combined.

3. The method defined in claim 1, wherein said depositing a silicon nitride layer includes depositing the silicon nitride layer to a thickness between about 1500 Å and about 3000 Å.

4. The method defined in claim 1, wherein said implanting ions includes implanting arsenic ions having an energy between about 50 KeV and about 100 KeV, and a dosage between about $1\times10^{14}$ atoms/cm$^2$ and about $1\times10^{16}$ atoms/cm$^2$.

5. The method defined in claim 1, wherein said implanting ions includes implanting phosphorus ions having an energy between about 20 KeV and about 60 KeV and a dosage between about $1\times10^{14}$ atoms/cm$^2$ and about $1\times10^{16}$ atoms/cm$^2$.

6. The method defined in claim 1, wherein said forming a gate oxide layer includes forming the gate oxide layer to a thickness between about 50 Å and about 250 Å.

* * * * *